United States Patent [19]

Seo

[11] Patent Number: 4,488,117
[45] Date of Patent: Dec. 11, 1984

[54] METHOD OF MEASURING BACKELECTROMOTIVE FORCES OF ALUMINUM ELECTROLYSIS CELLS

[75] Inventor: Yuzo Seo, Tokyo, Japan

[73] Assignee: Mitsubishi Keikinzoku Kogyo Kabushiki Kaisha, Tokyo, Japan

[21] Appl. No.: 370,189

[22] Filed: Apr. 21, 1982

[30] Foreign Application Priority Data

Apr. 28, 1981 [JP] Japan .................................. 56-65054

[51] Int. Cl.$^3$ ............................................ G01N 27/42
[52] U.S. Cl. ..................................... 324/425; 204/1 T
[58] Field of Search ................. 324/425; 204/1 T, 67, 204/228, 243 R

[56] References Cited

FOREIGN PATENT DOCUMENTS 4428 5/1977 Japan .

OTHER PUBLICATIONS

Asbjornsen et al., "Practical Experience with Real Time Parameter Estimation in an Alumina Reduction Cell", *Light Metals* (1980), pp. 361–389.

Lwellyn, "Determination of the Counter Electromotive Forces on Operating Aluminum Reduction Cells", *Journal of Metals*, Jul., 1979, pp. 57–59.

*Primary Examiner*—Michael J. Tokar
*Assistant Examiner*—Kevin D. O'Shea

*Attorney, Agent, or Firm*—Oblon, Fisher, Spivak, McClelland & Maier

[57] ABSTRACT

A backelectromotive force of an aluminum electrolysis cell is measured by the steps of: (a) repeatedly measuring voltage V and current I of the cell at a short interval; (b) forming groups of data each including measured values thus obtained within a relative short period; (c) calculating a constant e and its variance Ve with reference to each data group according to a linear regression expressed by an equation:

$$V = r \cdot I + e$$

where r represents an internal resistance of the cell; (d) calculating a backelectromotive force E and its variance $V_E$ at a given time based on the constant e and its variance Ve calculated at the step (c), a backelectromotive force E' and its variance $V'_E$ with reference to a data group preceding the given time and a constant $V_T$, and according to the following equations:

$$P = (V'_E + V_T)/(Ve + V'_E + V_T)$$

$$E = P \cdot e + (1 - P) \cdot E'$$

$$V_E = P^2 \cdot Ve + (1 - P)^2 \cdot (V'_E + V_T);$$

and (e) repeating the steps (b), (c) and (d) at a relatively short interval.

7 Claims, 1 Drawing Figure

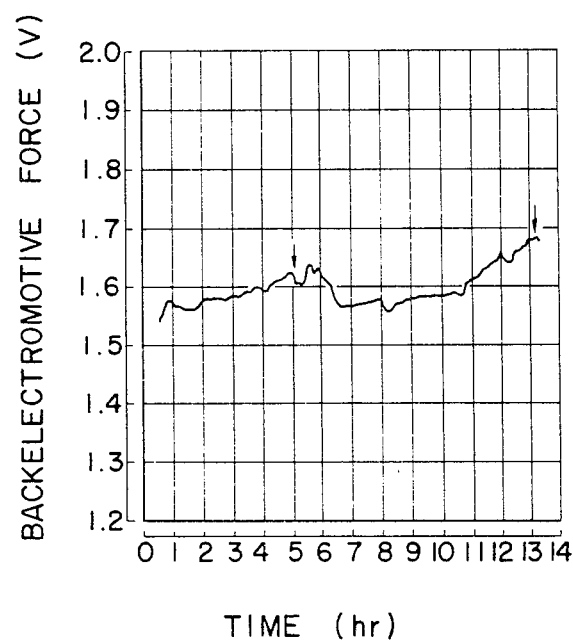

METHOD OF MEASURING BACKELECTROMOTIVE FORCES OF ALUMINUM ELECTROLYSIS CELLS

BACKGROUND OF THE INVENTION

1. Field of the Invention

This invention relates to a method of measuring a backelectromotive force of an aluminum electrolysis cell, and more particularly a method of calculating a backelectromotive force by repeatedly measuring the current and voltage of an aluminum electrolysis cell under a normal operating state at many times with short intervals and then statistically calculating the backelectromotive force based on the measured values.

2. Description of the Prior Art

It is well known in the art that the backelectromotive force of an aluminum electrolysis cell can be used as indices showing the operating states of the cell, such as the concentration of alumina in the electrolytic bath, short circuiting of electrodes, etc.

The backelectromotive force E can be determined according to the following equation (1) based on the measured values of the cell current I and the cell voltage V.

$$V = r \cdot I + E \qquad (1)$$

where r represents the internal resistance of the cell. However, in order to determine the accurate value of the backelectromotive force according to this method it is necessary to vary greatly the cell current as disclosed in Japanese patent publication No. 44285/1977. However, this method is not advantageous for the stable operation of the electrolysis cell.

During the operation of an aluminum electrolysis cell, an anode effect occurs at a frequency of several times in one day or once per several days. In an electrolysis cell in which an anode effect has occurred, the cell voltage temporarily rises by several tens of volts while the cell current temporarily decreases. In an aluminum electrolysis factory it is usual that several tens to several hundreds of electrolysis cells are connected in series to form a line of the electrolysis cells so that the cell current decreases temporarily at a frequency of once per several to several tens of minutes due to the anode effect. But as the extent of decrease in the cell current due to the anode effect is small it is difficult or almost impossible to measure directly the backelectromotive force according to equation (1) by utilizing such variation in the cell current.

As a result of my investigation regarding the current variation caused by the anode effect, I have found that the backelectromotive force can be measured at high accuracies according to a statistical method utilizing the current variation.

SUMMARY OF THE INVENTION

Accordingly, an object of this invention is to provide a novel method of measuring the backelectromotive force of an aluminum electrolysis cell.

Another object of this invention is to provide a novel method of calculating the backelectromotive force of an aluminum electrolysis cell by a statistical method in which the current and voltage of the cell operating under a normal state are measured repeatedly at a short interval and measured values of the current and voltage are used for the calculation.

According to this invention there is provided a method of measuring a backelectromotive force of an aluminum electrolysis cell comprising the steps of (a) repeatedly measuring voltage V and current I of the cell at a short interval; (b) forming groups of data each including measured values thus obtained within a relatively short period; (c) calculating a constant e and its variance Ve with reference to each data group according to a linear regression expressed by an equation (2)

$$V = r \cdot I + e \qquad (2)$$

where r represents an internal resistance of the cell; (d) calculating a backelectromotive force E and its variance $V_E$ at a given time based on the constant e and its variance $V_e$ calculated at the step (c), a backelectromotive force E' and its variance $V'_E$ with reference to a data group preceding the given time and a constant $V_T$ and according to the following equations:

$$P = (V'_E + V_T)/(Ve + V'_E + V_T) \qquad (3)$$

$$E = P \cdot e + (1 - P) \cdot E' \qquad (4)$$

$$V_E = P^2 \cdot Ve + (1 - P)^2 \cdot (V'_E + V_T) \qquad (5)$$

where P represents a parameter; and (e) repeating the steps (b), (c) and (d) at a relatively short interval.

According to a modified embodiment, the steps (b), (c) and (d) are modified as follows:

(b) successively calculating, at a relatively short interval, a weighted mean value $\overline{V}$ and its variance $V_V$ of the cell voltage, a weighted mean value $\overline{I}$ and its variance $V_I$ of the cell current and their common variance $C_{VI}$ based on the values of the voltage and current measured within a relatively short period at step (a), (c) calculating a constant e and its variance Ve in an equation $V = r \cdot I + e$ (where r represents an internal resistance of the electrolysis cell) according to the following equations:

$$r = C_{VI}/V_I$$

$$e = \overline{V} - r \cdot \overline{I}$$

$$V_\epsilon = V_V - r^2 \cdot V_I$$

$$Ve = V_\epsilon(1 + \overline{I}^2/V_I)$$

by utilizing the values calculated at step (b), (d) calculating a backelectromotive force E and its variance $V_E$ according to the following equations:

$$P = (V'_E + V_T)/(Ve + V'_E + V_T)$$

$$E = P \cdot e + (1 - P) \cdot E'$$

$$V_E = P^2 \cdot Ve + (1 - P)^2 \cdot (V'_E + V_T)$$

by utilizing the constant e and its variance Ve calculated at step (c) at a given time and a backelectromotive force E' and its variance $V'_E$ calculated at a time preceding the given time and a constant $V_T$.

BRIEF DESCRIPTION OF THE DRAWING

In the accompanying drawing, a single FIGURE shows the relation between the backelectromotive force V (ordinate) measured according to the method of this invention and time (abscissa).

DESCRIPTION OF THE PREFERRED EMBODIMENT

Briefly stated, according to the method of this invention, the backelectromotive force of an aluminum electrolysis cell is measured or calculated statistically by utilizing a current variation caused by an anode effect occurring in a line of a plurality of electrolysis cells at a rate of once per several to several tens of minutes.

More particularly, according to this invention, cell current I and cell voltage V are repeatedly measured many times with a short interval for sequentially forming data groups each consisting of a number of measured values so as to calculate the backelectromotive force for each group. Usually, the measurements are made consecutively at a definite interval. Measured values constituting respective data groups may be independent or overlap partially. Assume now that Xn represents a nth measured value and that each data group is made up of 100 measured values. Then, the data groups may be constituted by independent measured values as $(x_1, x_2, \ldots x_{100})$, $(x_{101}, x_{102}, \ldots x_{200})$, $(x_{201}, x_{202}, \ldots x_{300})$ ... or constituted by partially overlapping measured values as $(x_1, x_2, \ldots x_{100})$, $(x_{51}, x_{52}, \ldots x_{150})$, $(x_{101}, x_{102}, \ldots x_{200})$ ...

Each data group is constituted by measured values over a period longer than one period of a current variation caused by the anode effect. Usually, this period of variation is about 15–25 seconds, but if the measured values of a data group are included in this period of variation, the accuracy of the regression calculated according to the following equation (2) is not high thus disenabling the calculation of an accurate backelectromotive force.

$$V = r \cdot I + e \quad (2)$$

where V represents the cell voltage, r the internal resistance of the cell, I the cell current and e a constant.

Each data group is constituted by measured values in a period in which the anode effect sustains which usually amounts to 1–5 minutes. Where a data group is constituted by measured values in a period longer than the sustain period, the measured values over a period in which current is stable would be included in each data group thereby degrading the accuracy of regression calculated with equation (2) in the same manner as above described. Considering the effect of these factors upon the accuracy of the regression obtained by equation (2) it is advantageous to construct each data group with measured values for 1 to 4 minutes.

Each data group contains at least 10 measured values. Since the accuracy of the regression can be improved by increasing the number of the measured values, it is advantageous to measure many times with a short interval between successive measurements. Since the cell voltage contains an oscillation component having a period of less than one second caused by a reaction gas evolved from the bottom surface of the anode electrode, it is preferred to eliminate such oscillation component with an analogue or digital filter (low pass filter) at the time of measuring the cell voltage V. 1 to 3 seconds are suitable for the time constant of the filter. Where a filter is used, it is advantageous to obtain the measured values at an interval substantially equal to the time constant of the filter, although in a certain case the interval may be shorter than the time constant.

According to the method of this invention with reference to each data group, the constant e and its variance Ve are calculated with equation (2). Usually, this calculation may be executed by the method of least squares. However, it is more advantageous to calculate the constant e and its variance Ve with the method of weighted least squares. According to this method, each time the cell voltage V and cell current I are measured the filter value f is calculated according to the following equations:

$$f_V = q \cdot V + (1-q) f'_V \quad (6)$$

$$f_{V^2} = q \cdot V^2 + (1-q) f'_{V^2} \quad (7)$$

$$f_{VI} = q \cdot V \cdot I + (1-q) f'_{VI} \quad (8)$$

$$f_{I^2} = q \cdot I^2 + (1-q) f'_{I^2} \quad (9)$$

$$f_I = q \cdot I + (1-q) f'_I \quad (10)$$

where f' represents a filter value based on the previously measured value, q is a value expressed by a relation $0 < q < 1$ in which q satisfies the following equation.

$$\tau = t(1-q)/q \quad (11)$$

in which t represents an interval between adjacent measured values, $\tau$ the time constant of the regression filter, that is a weighted mean value of the period between the time when the value of I or V is obtained and the time when the filter value f is calculated. Consequently, it can be considered that the value f represents a data group consisting of the measured values in a period substantially equal to $2\tau$, so that in this specification $2\tau$ is treated as a measuring period for a data group. Accordingly, as above described it is advantageous that $2\tau$ lies in a range of from 1 to 4 minutes.

When calculating the filter value f starting from the first measured value, calculation may be executed on the assumption that $q=1$.

By using the filter value f, the constant e and its variance Ve in equation (2) can be calculated according to the following equations (12) through (20). More particularly, weighted mean values $\overline{V}$ and $\overline{I}$ of the cell current I and cell voltage V, their variances $V_V$ and $V_I$ and common variances $C_{VI}$ are calculated according to equations (12)–(16).

$$\overline{V} = f_V \quad (12)$$

$$\overline{I} = f_I \quad (13)$$

$$V_V = f_{V^2} - \overline{V}^2 \quad (14)$$

$$V_I = f_{I^2} - \overline{I}^2 \quad (15)$$

$$C_{VI} = f_{VI} - \overline{V} \cdot \overline{I} \quad (16)$$

Finally, the constant e and its variance Ve are calculated according to the following equations:

$$r = C_{VI}/V_I \quad (17)$$

$$e = \overline{V} - r \cdot \overline{I} \quad (18)$$

$$V_\epsilon = V_V - r^2 \cdot V_I \quad (19)$$

$$V_e = V_\epsilon (1 + \overline{I}^2/V_I) \quad (20)$$

Regardless of the fact that whether an ordinary method of least squares or a weighted method of least squares is used, it is advantageous to calculate the constant e and its variance Ve at an interval of less than 4 minutes. Where data groups are formed successively by continually measuring the cell current and cell voltage at a predetermined interval such that measured values belonging to adjacent data groups do not overlap each other, the calculating interval of the constant e and its variance Ve coincides with the measuring period of the data groups. Where the measured values of adjacent data groups overlap each other, the calculating interval becomes shorter than the measuring period. Provision of a period in which no measurement is made between adjacent measuring periods prolongs the calculating interval than the measuring period thus degrading the accuracy of the calculation. Where the weighted method of least squares is used, it is preferable to calculate the constant e and its variance Ve at an interval substantially equal to the time constant of the regression filter.

The backelectromotive force E is calculated as follows by using the constant e and its variance Ve thus obtained.

$$E = P \cdot e + (1-P)E' \quad (21)$$

where E' represents a previously calculated backelectromotive force, and P a parameter. The variance $V_E$ of the backelectromotive force E is expressed as follows:

$$V_E = P^2 \cdot Ve + (1-P)^2 \cdot (V'_E + V_T) \quad (22)$$

where $V'_E$ represents the variance of the previously calculated backelectromotive force E', and $V_T$ a preset constant set as a variance caused by variation with time of the backelectromotive force between the previous and the present measuring times. Usually the constant $V_T$ is calculated by setting a variance corresponding to a variation with time of 3 mV/min.−30 mV/min. Although it is possible to catch minute variations of the backelectromotive force when the constant $V_T$ is selected as a large value, noise increases. Conversely, when the value of $V_T$ is made to be small the value of the backelectromotive force stabilizes, but it becomes difficult to accurately measure its variation. For this reason, it is advantageous to select a suitable value for $V_T$ according to the accuracy and response speed required for the backelectromotive force.

From equation (22), it can be noted that the value of P at which the variance $V_E$ of the backelectromotive force becomes a minimum is given by the following equation (23).

$$P = (V'_E + V_T)/(Ve + V'_E + V_T) \quad (23)$$

As can be noted from equations (21), (22) and (23), each time the constant e and its variance Ve are calculated the backelectromotive force E and its variance $V_E$ corresponding thereto can be calculated. When calculating the backelectromotove force for the first time the parameter P may be made to be 1.

According to the method of this invention, it is possible to continuously check the backelectromotive force of an aluminum electrolysis cell by utilizing anode effects inevitable for a line of electrolysis cells.

To have better understanding of the invention the following examples are given, but not intended to limit the scope of this invention.

EXAMPLE

The cell voltage and cell current of an electrolysis cell of a rating of 100 KA and provided with a self-baking type anode electrode were measured at an interval of 0.2 second. The measured values were passed through a digital filter having a time constant of 1.4 seconds to obtain measured values at an interval of 0.2 sec. By utilizing these measured values and $q = 2^{-8}$ (that is $\tau$ =about 0.85 min.) the filter value f was calculated according to equations (6) through (10). Then, by utilizing this filter value the backelectromotive force was calculated at an interval of one minute according to equations (12) through (22). For this calculation, it was assumed that $V_T = 10^{-4}$ (V$^2$/min.$^2$). In other words, the variation with time of the backelectromotive force was assumed to be 10 mV/min. The result is shown in the accompanying drawing in which the ordinate shows the backelectromotive force in volt, abscissa the time in hour, and arrows the anode effects. It has been recognized that prior to the occurrence of an anode effect, the backelectromotive force increases gradually, but it decreases rapidly after disappearance of the anode effect. The drawing shows that the backelectromotive force varies in the same manner before and after the occurrence of the anode effect. Consequently, according to this invention it is possible to accurately check the backelectromotive force of the electrolysis cell.

I claim:

1. A method of measuring a backelectromotive force of an aluminum electrolysis cell comprising the steps of:
    (a) repeatedly measuring voltage V and current I of said cell at a short interval;
    (b) forming groups of data each including measured values thus obtained within a relatively short period;
    (c) calculating a constant e and its variance Ve with reference to each data group according to a linear regression expressed by an equation $$V = r \cdot I + e$$

where r represents an internal resistance of said cell;
    (d) calculating a backelectromotive force E and its variance $V_E$ at a given time based on said constant e and its variance Ve calculated at said step (c), a backelectromotive force E' and its variance $V'_E$ with reference to a data group preceding said given time and a constant $V_T$, and according to the following equations:

$$P = (V'_E + V_T)/(Ve + V'_E + V_T)$$

$$E = P \cdot e + (1-P) \cdot E'$$

$$V_E = P^2 \cdot Ve + (1-P)^2 \cdot (V'_E + V_T)$$

where P represents a parameter; and
    (e) repeating said steps (a), (b), (c) and (d) at a relatively short interval.

2. The method according to claim 1 wherein each of said data groups contains at least 10 measured values measured in continual measuring periods each having a length of 1 to 4 minutes.

3. The method according to claim 1 or 2 wherein the calculation of said backelectromotive force is repeated at an interval of less than 4 minutes.

4. A method of measuring a backelectromotive force of an aluminum electrolysis cell comprising the steps of:
   (a) repeatedly measuring voltage V and current I of said cell at a short interval;
   (b) calculating, at a relatively short interval, a weighted mean value $\bar{V}$ and its variance $V_V$ of said cell voltage, a weighted mean value $\bar{I}$ and its variance $V_I$ of said cell current and their common variance $C_{VI}$, based on the values of said voltage and current measured within a relatively short period at step (a);
   (c) calculating a constant e and its variance Ve in an equation $V = r \cdot I + e$ (where r represents an internal resistance of said electrolysis cell) according to the following equations:

$r = C_{VI}/V_I$ $e = \bar{V} - r \cdot \bar{I}$ $V_\epsilon = V_V - r^2 V_I$ $Ve = V_\epsilon(1 + \bar{I}^2/V_I)$;

by utilizing the values calculated at step (b), (d) calculating a backelectromotive force E and its variance $V_E$ according to the following equations:

$P = (V'_E + V_T)/(Ve + V'_E + V_T)$ $E = P \cdot e + (1-P) \cdot E'$ $V_E = P^2 \cdot Ve + (1-P)^2 \cdot (V'_E + V_T)$ by utilizing the constant e and its variance Ve calculated at step (c) at a given time and a backelectromotive force E' and its variance $V'_E$ calculated at a time preceding said given time and a constant $V_T$; and
   (e) repeating the steps (a), (b), (c) and (d) at a relatively short interval.

5. The method according to claim 4 wherein measurements of said cell voltage and said cell current are performed continually at a predetermined interval.

6. The method according to claim 4 or 5 wherein said weighted mean values of said cell voltage and said cell current are calculated using a filtering time constant of from 0.5 to 2 minutes and a number of said measured voltage and current values in a period equal to said filtering time constant is larger than 5.

7. The method according to claim 4 or 5 wherein said weighted mean values of said cell current and cell voltage, their variances and common variances are calculated at an interval of less than 4 minutes.

* * * * *